US009343659B1

(12) United States Patent
Lu et al.

(10) Patent No.: US 9,343,659 B1
(45) Date of Patent: May 17, 2016

(54) EMBEDDED MAGNETORESISTIVE RANDOM ACCESS MEMORY (MRAM) INTEGRATION WITH TOP CONTACTS

(71) Applicant: QUALCOMM Incorporated, San Diego, CA (US)

(72) Inventors: Yu Lu, San Diego, CA (US); Wei-Chuan Chen, Taipei (TW); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/625,494

(22) Filed: Feb. 18, 2015

Related U.S. Application Data

(60) Provisional application No. 62/077,018, filed on Nov. 7, 2014.

(51) Int. Cl.
| | |
|---|---|
| *H01L 21/00* | (2006.01) |
| *H01L 43/08* | (2006.01) |
| *H01L 43/02* | (2006.01) |
| *H01L 43/12* | (2006.01) |

(52) U.S. Cl.
CPC ............. *H01L 43/08* (2013.01); *H01L 43/02* (2013.01); *H01L 43/12* (2013.01)

(58) Field of Classification Search
CPC .............. H01L 28/55; H01L 27/11502; H01L 27/11507; H01L 43/12; H01L 21/31691
USPC .............................................................. 438/3
See application file for complete search history.

(56) References Cited

U.S. PATENT DOCUMENTS

| | | | |
|---|---|---|---|
| 7,635,884 B2 | 12/2009 | Gaidis et al. | |
| 8,569,849 B2 | 10/2013 | Huang et al. | |
| 8,841,739 B2 | 9/2014 | Khalili et al. | |
| 8,847,338 B2 * | 9/2014 | Assefa | H01L 27/222 257/415 |
| 2006/0148234 A1 | 7/2006 | Chen et al. | |
| 2009/0209050 A1 | 8/2009 | Wang et al. | |
| 2011/0272380 A1 | 11/2011 | Jeong et al. | |
| 2012/0205764 A1 | 8/2012 | Chen et al. | |
| 2012/0326250 A1 | 12/2012 | Gaidis et al. | |
| 2015/0325622 A1 * | 11/2015 | Zhang | H01L 27/222 257/421 |

OTHER PUBLICATIONS

International Search Report and Written Opinion—PCT/US2015/056166—ISA/EPO—Jan. 19, 2016.

* cited by examiner

*Primary Examiner* — Quoc Hoang
(74) *Attorney, Agent, or Firm* — Muncy, Geissler, Olds & Lowe, P.C.

(57) ABSTRACT

A magnetoresistive random access memory (MRAM) device includes a top electrode or top contact above a metal hard mask which has a limited height due to process limitations in advanced nodes. The metal hard mask is provided on a magnetic tunnel junction (MTJ). The top contact for the MTJ is formed within a dielectric layer, such as a low dielectric constant (low-k) or extremely low-k layer. An additional dielectric layer is provided above the top contact for additional connections for additional circuitry to form a three-dimensional integrated circuit (3D IC).

11 Claims, 11 Drawing Sheets

FIG. 3B

EMBEDDED MAGNETORESISTIVE RANDOM ACCESS MEMORY (MRAM) INTEGRATION WITH TOP CONTACTS

CLAIM OF PRIORITY UNDER 35 U.S.C. §119

The present Application for Patent claims priority to Provisional Application No. 62/077,018, entitled "EMBEDDED MAGNETORESISTIVE RANDOM ACCESS MEMORY (MRAM) INTEGRATION WITH TOP CONTACTS," filed Nov. 7, 2014, and assigned to the assignee hereof and hereby expressly incorporated by reference herein.

FIELD OF DISCLOSURE

Various embodiments described herein relate to semiconductor devices, and more particularly, to magnetoresistive random access memory (MRAM) devices.

BACKGROUND

Magnetoresistive random access memory (MRAM) devices with magnetic tunnel junctions (MTJs) have shown desirable characteristics that are believed to be advantageous over conventional non-volatile memory and random access memory (RAM) technologies. The dimensions of MRAM elements are progressively scaled down to increase the densities of MRAM devices for larger scale integration. Attempts have been made to fabricate MRAM devices with advanced semiconductor processing technologies for smaller nodes, for example, for 40 nm nodes or below. However, as the size of an MRAM device is scaled down making an electrical contact to the top electrode of an MTJ becomes increasingly difficult due to the scaling down of the vertical height of the interconnect via and the intrinsic etch profile of MRAM device and the critical dimension (CD) of the MTJ.

Various solutions have been proposed for making top electrical contacts to MTJs in MRAM devices in advanced process nodes. For example, a critical planarization step using a conventional planarization process, such as a chemical mechanical planarization (CMP) process, has been proposed to expose the top electrodes of the MTJs. However, the final MTJ metal hard mask height will be limited by the tolerance of the CMP process step, which degrades yield and is not suitable for advanced process nodes, such as the 28 nm node.

Other techniques that have been proposed for forming top electrical contacts to MTJs with relatively large dimensions include using special vias or landing a subsequent back-end-of-line (BEOL) interconnect level on the MTJs. However, these techniques are typically not practical in advanced process nodes that are 40 nm or below.

SUMMARY

Exemplary embodiments of the disclosure are directed to a magnetoresistive random access memory (MRAM) device and a method of making the same.

In an embodiment, an MRAM device is provided, the device comprising: a first dielectric layer; a second dielectric layer; a magnetic tunnel junction (MTJ) disposed between the first dielectric layer and the second dielectric layer; a metal hard mask coupled to the MTJ; a top contact coupled to the metal hard mask; and a conductive layer directly on the top contact.

In another embodiment, a method of making an MRAM device is provided, the method comprising: forming a first dielectric layer; forming a second dielectric layer; forming a magnetic tunnel junction (MTJ) between the first dielectric layer and the second dielectric layer; forming a metal hard mask on the MTJ; forming a top contact coupled to the metal hard mask; and forming a conductive layer directly on the top contact.

In yet another embodiment, a method for making an MRAM device is provided, the method comprising the steps for: forming a first dielectric layer; forming a second dielectric layer; forming a magnetic tunnel junction (MTJ) between the first dielectric layer and the second dielectric layer; forming a metal hard mask on the MTJ; forming a top contact coupled to the metal hard mask; and forming a conductive layer directly on the top contact.

BRIEF DESCRIPTION OF THE DRAWINGS

The accompanying drawings are presented to aid in the description of embodiments of the disclosure and are provided solely for illustration of the embodiments and not limitation thereof.

FIG. 3B is a cross-sectional view illustrating an embodiment of a process following the dielectric filling and planarizing processes in the embodiment illustrated in FIG. 3A.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
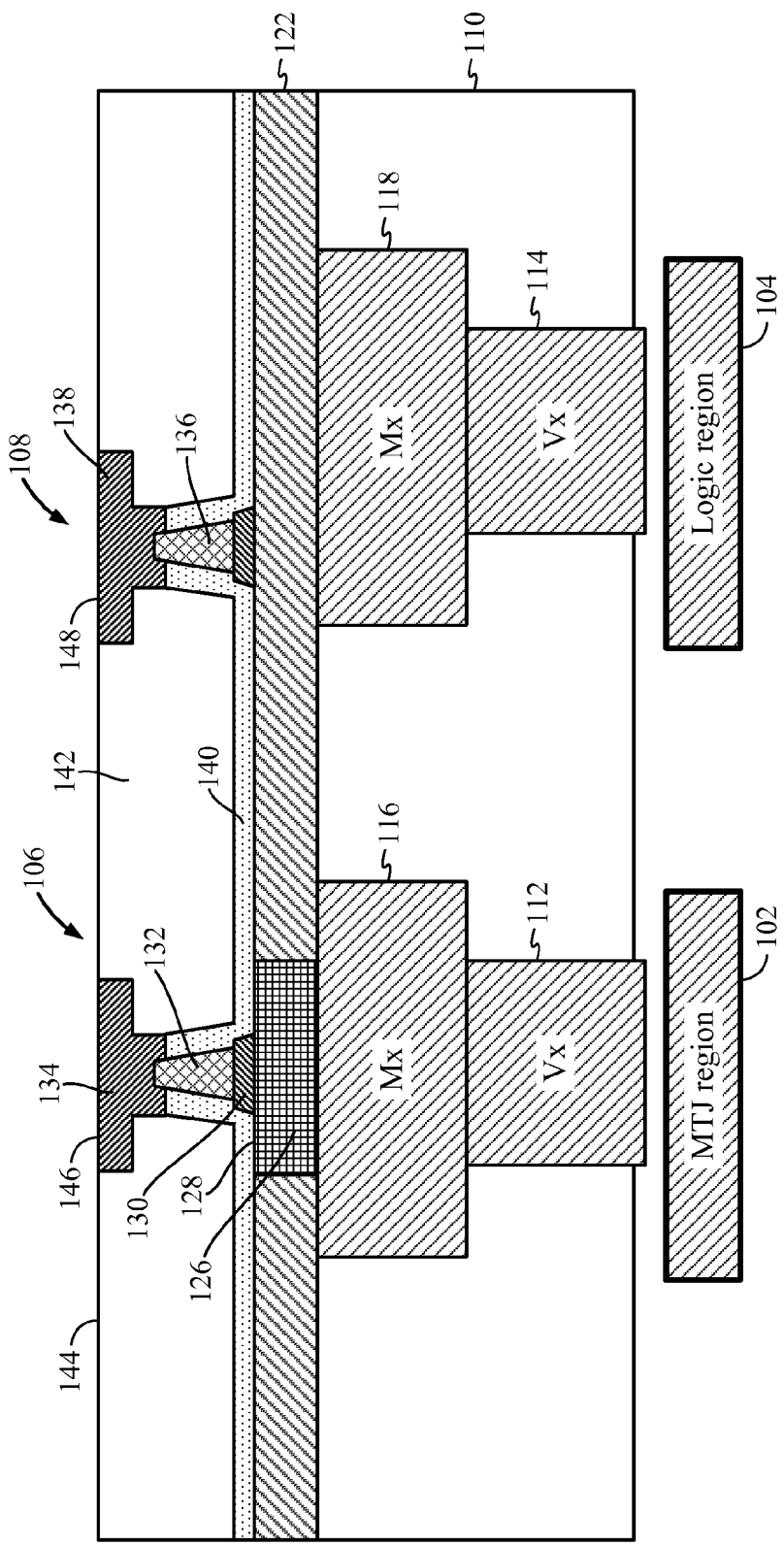
FIG. 1 is a cross-sectional view of an embodiment of a magnetoresistive random access memory (MRAM) device having a magnetic tunnel junction (MTJ) region and a logic region.

FIG. 1 is a cross-sectional view of an embodiment of a magnetoresistive random access memory (MRAM) device having a magnetic tunnel junction (MTJ) region 102 and a logic region 104 after fabrication is completed. For simplicity of illustration, only one exemplary MTJ contact 106 in the MTJ region 102 and one exemplary MTJ dummy fill structure 108 in the logic region 104 are shown in FIG. 1. In FIG. 1, both the MTJ region 102 and the logic region 104 are fabricated on the same chip and thus share a first dielectric layer 110. In an embodiment, the first dielectric layer 110 may comprise a low dielectric constant (low-k) layer. Within the first dielectric layer 110, a plurality of vias ($V_x$) 112 and 114 and a plurality of metals ($M_x$) 116 and 118 may be provided. In an embodiment, the vias 112 and 114 may be filled with metal fills to provide electrical connections to the metals 116 and 118, respectively. Alternatively, one or more dielectric or insulator layers and one or more layers of metals may be provided in various conventional manners known to persons skilled in the art to provide electrical connections to contacts above.

As shown in the embodiment of FIG. 1, within the MTJ region 102, an MTJ 130 is provided on top of the bottom electrode 126, which is provided on top of the metal ($M_x$) 116. In an embodiment, a magnetic tunnel junction (MTJ) 130 is provided on the top surface 128 of the bottom electrode 126. Various types of conventional MTJ structures may be implemented within the scope of the disclosure. For example, the MTJ 130 may include a bottom magnetic layer in contact with the top surface 128 of the bottom electrode 126, a tunnel barrier and one or more additional magnetic layers, and may also optionally include one or more layers (not shown for clarity of illustration in FIG. 1) known to persons skilled in the art. In an embodiment, a metal hard mask 132 is provided on top of the MTJ 130, and a top electrode or top contact 134 is provided on top of the metal hard mask 132. In an embodiment, the said top contact 134 is fabricated using a so called metal damascene process. The fabrication process for providing the top contact 134 on top of the metal hard mask 132 will be described in further detailed below with respect to embodiments as illustrated in FIGS. 2-9.

Referring to FIG. 1, a dummy fill structure 108 is provided in the logic region 104 as part of the fabrication process for making MTJ contacts. As shown in FIG. 1, a dummy MTJ is provided above the metal 118 in the logic region 104. In an embodiment, the dummy MTJ is electrically isolated from metal line 118 in the logic region of the device by the absence of a bottom electrode structure. In an embodiment, a metal hard mask 136 is also provided in the logic region 104, and a top electrode or top contact 138 is provided on top of the metal hard mask 136. In an embodiment, an encapsulation layer 140 is provided on top of a dielectric layer 122 and on the sides of the metal hard masks 132 and 136. In a further embodiment, a second dielectric layer 142 is provided on top of the encapsulation layer 140 and around the top contacts 134 and 138 in both the MTJ region 102 and the logic region 104. In an embodiment, the top surface 144 of the second dielectric layer 142 is substantially flush with the top surface 146 of the top contact 134 in the MTJ region 102 and the top surface 148 of the top contact 138 in the logic region 104 after planarization or polishing, which will be described in further detail below.

Figure 2:
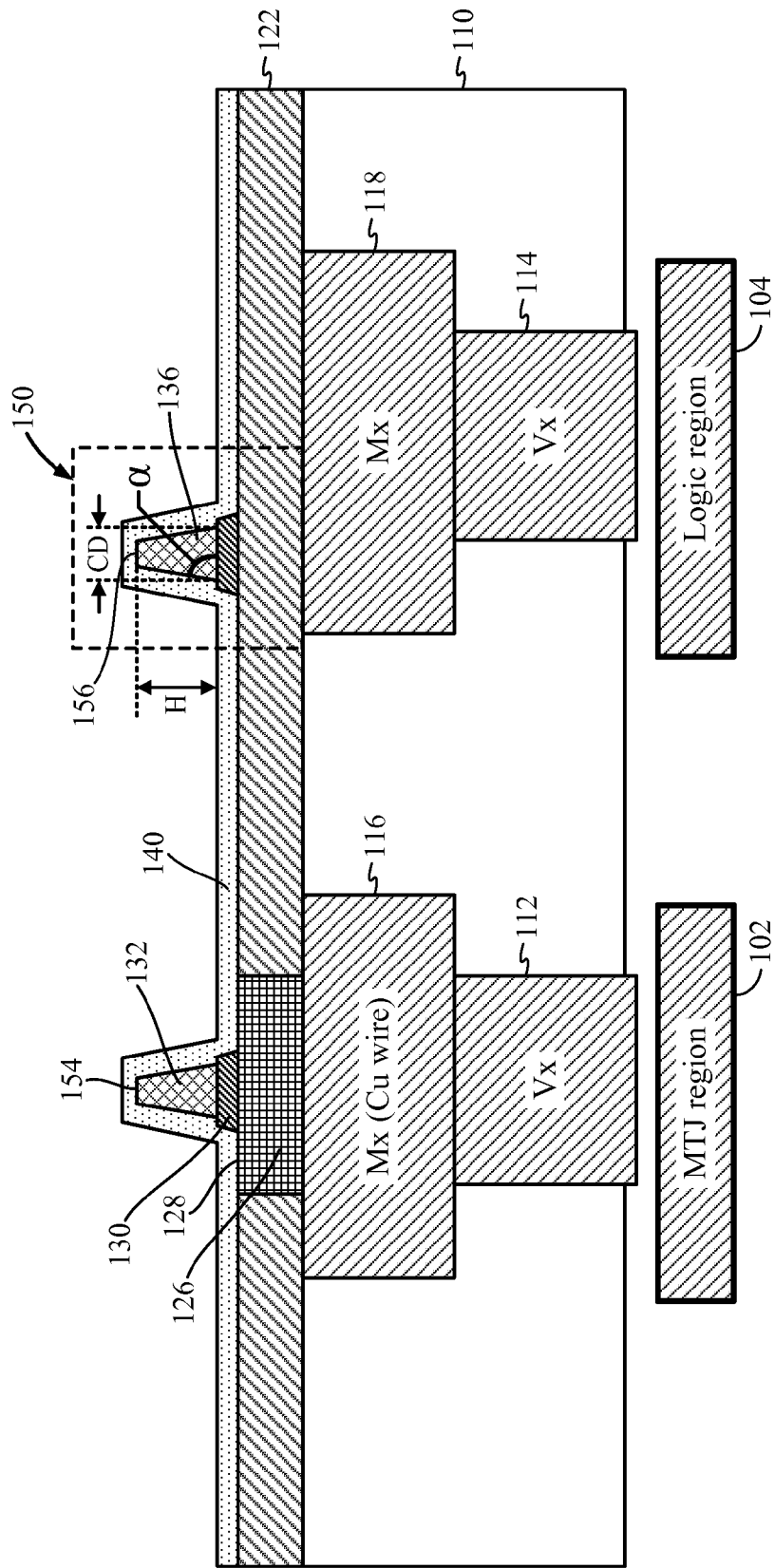
FIG. 2 is a cross-sectional view illustrating an embodiment of an MRAM device before forming top contacts in the MTJ region and the logic region.

FIG. 2 is a cross-sectional view illustrating an embodiment of the device before forming the top contacts in the MTJ region and the logic region. In various embodiments, an MTJ 130 having any of the conventional MTJ structures known to persons skilled in the art may be formed on top of the metal 116 in the MTJ region 102 in a conventional manner. For example, an MTJ having multiple layers of metals or alloys above or below a tunneling insulator layer may be provided on top of the bottom electrode 126, which serves as a bottom electrode for the MTJ, in a conventional manner. In the logic region 104, a dummy MTJ 150 is provided which includes a metal hard mask 136. In practice, the height H of the metal hard masks 132 and 136 after formation of MTJ devices may be limited by the bottom critical dimension (CD) as well as the sidewall angle (SWA) $\alpha$ of the metal hard masks. For example, in an exemplary 28 nm process node, the SWA $\alpha$ of metal hard masks is typically in the range of approximately 70° to 80°, and the height H of the metal hard masks 132 and 136 is typically limited to approximately 50 nm. Because it is typically difficult in practice to form metal hard masks with a high aspect ratio, the height H of the metal hard mask 132 may not be sufficient to serve as a top electrode or top contact for the MTJ 130.

In an embodiment, the encapsulation layer 140 may be formed on a dielectric layer 122 and over the metal hard masks 132 and 136 as shown in FIG. 2 by using a passivation layer deposition process. In an embodiment, the encapsulation layer 140 may comprise an oxide or nitride material, another type of dielectric material, or combination of different types of dielectric material. In an embodiment in which a passivation layer deposition process is used in forming the encapsulation layer 140, etching back of the passivation layer is skipped such that the encapsulation layer 140 remains on the top surfaces 154 and 156 of the metal hard masks 132 and 136, respectively, as well as on the sidewalls of these metal hard masks. As shown in FIG. 2, the top surfaces 154 and 156 of the metal hard masks 132 and 136 are not exposed after passivation layer deposition. In alternate embodiments, other conventional processes may also be used in forming the encapsulation layer 140, and no etching back or removal of portions of the encapsulation layer 140 would be necessary to expose the top surfaces 154 and 156 of the metal hard masks 132 and 136.

Figure 3A:
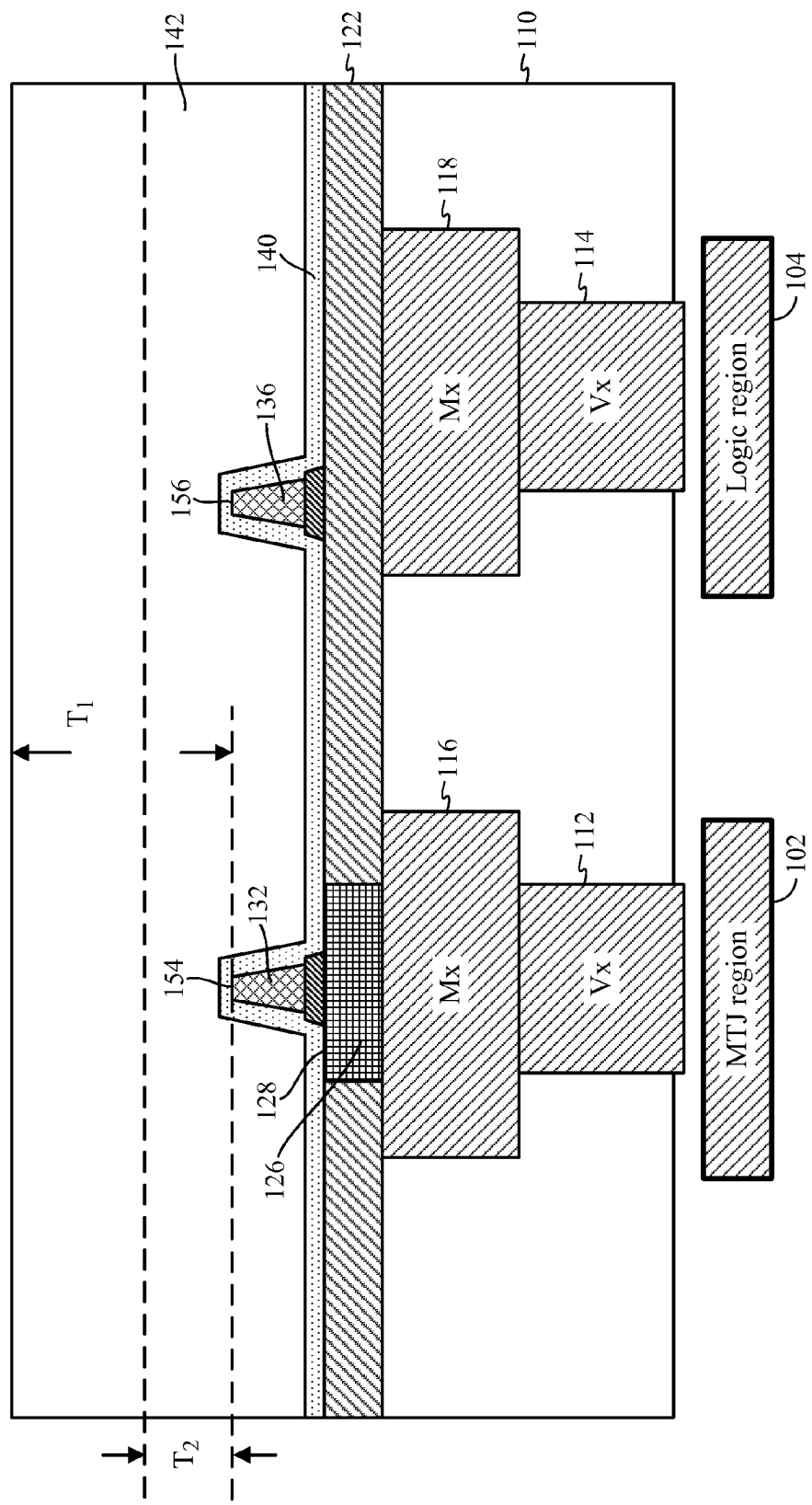
FIG. 3A is a cross-sectional view illustrating an embodiment of filling and planarizing a second dielectric layer above an encapsulation layer after the encapsulation layer is deposited on a buffer layer and metal hard masks.

FIG. 3A is a cross-sectional view illustrating an embodiment of filling and planarizing the second dielectric layer 142 above the encapsulation layer 140 after the encapsulation layer 140 is deposited on as illustrated in FIG. 2. Referring to FIG. 3A, a sufficiently thick layer of dielectric material is filled above the top surfaces 154 and 156 of the metal hard masks 132 and 136. In an exemplary 28 nm process node, for example, the dielectric material may be filled to a height $T_1$ in the range of about 100 nm to 200 nm above the top surfaces 154 and 156 of the metal hard masks 132 and 136. The initial filling of the dielectric material above the top surfaces 154 and 156 of the metal hard masks 132 and 136 need not be set to a precise height as long as a sufficiently thick layer of dielectric material is initially provided for grinding or planarization.

After the thick layer of dielectric material fills the top of the encapsulation layer 140, the dielectric material may be ground or polished back to a height $T_2$ above the top surfaces 154 and 156 of the metal hard masks 132 and 136. In an exemplary 28 nm process node, for example, the dielectric material may be ground or polished to a height $T_2$ of approximately 50 nm above the top surfaces 154 and 156 of the metal hard masks 132 and 136. In an embodiment, a chemical mechanical planarization (CMP) process may be used to reduce the height of the dielectric material from $T_1$ to $T_2$ above the top surfaces 154 and 156 of the metal hard masks 132 and 136 to form the second dielectric layer 142. In an alternate embodiment, the height of the dielectric material may be reduced from $T_1$ to $T_2$ by applying a spin-on-glass (SOG) etch-back planarization process to the dielectric material to form the second dielectric layer 142. Other polishing or planarizing processes may also be applied to reduce the height of the dielectric material in manners known to persons skilled in the art. In the embodiment shown in FIG. 3A, the metal hard mask 136, which serves as a dummy in the logic region 104, is provided to avoid top electrode "puddles" in the logic region 104 in which active MTJs are not implemented.

Figure 3B:
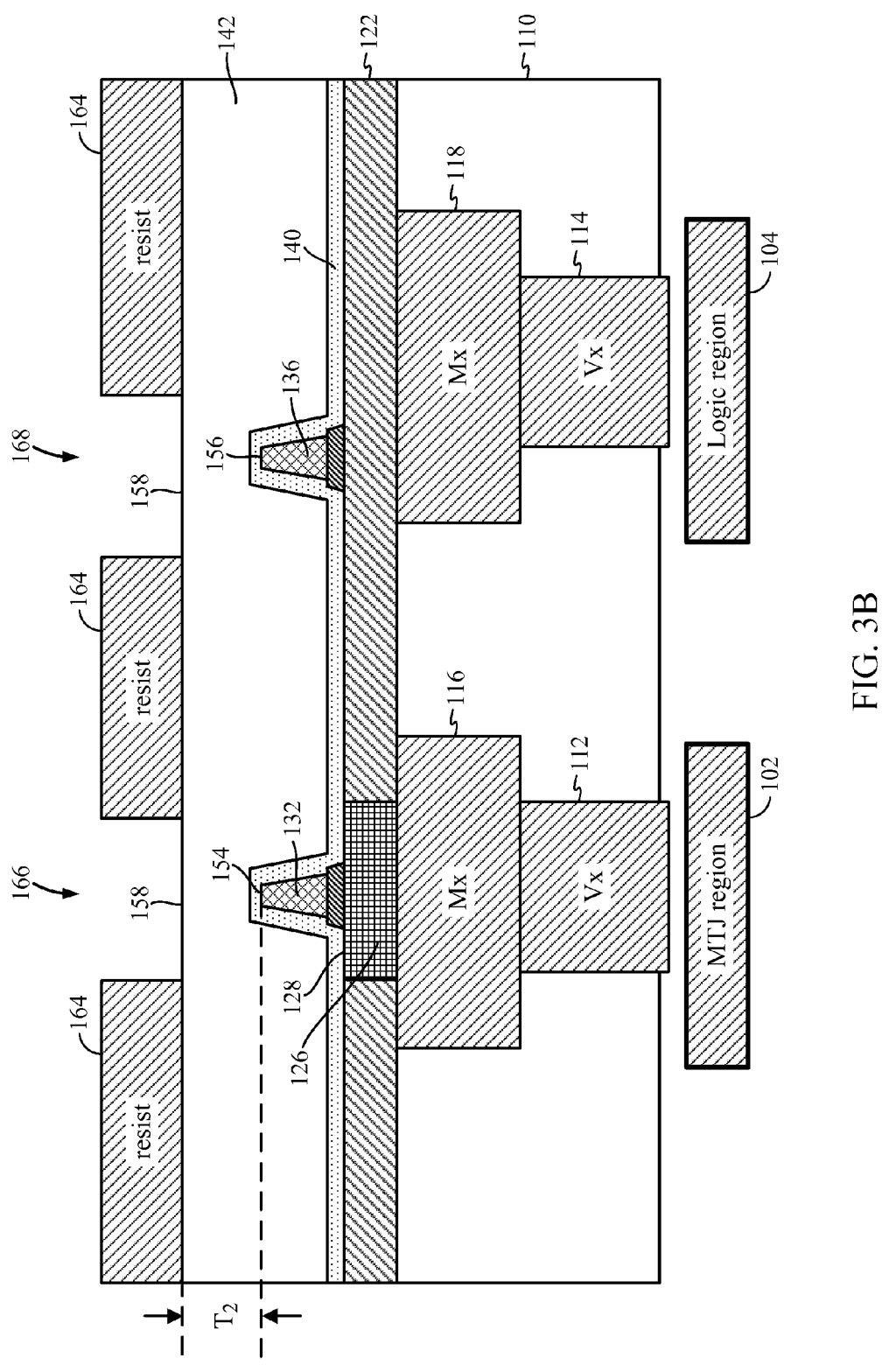

FIG. 3B is a cross-sectional view illustrating an embodiment of a process following the dielectric filling and polishing or planarizing processes in the embodiment illustrated in FIG. 3A. In FIG. 3B, after the second dielectric layer 142 having a height $T_2$ over the top surfaces 154 and 156 of the metal hard masks 132 and 136 is formed, a patterned resist layer 164 may be formed on the top surface 158 of the second dielectric layer 142. In an embodiment, openings 166 and 168 are provided in the patterned resist layer 164 to expose the areas over the metal hard masks 132 and 136, respectively. In an embodiment, the patterned resist layer 164 comprises a photoresist layer which is provided on the top surface 158 of the second dielectric layer 142 to expose the areas over the metal hard masks 132 and 136 by using a photolithographic process, for example.

Figure 4A:
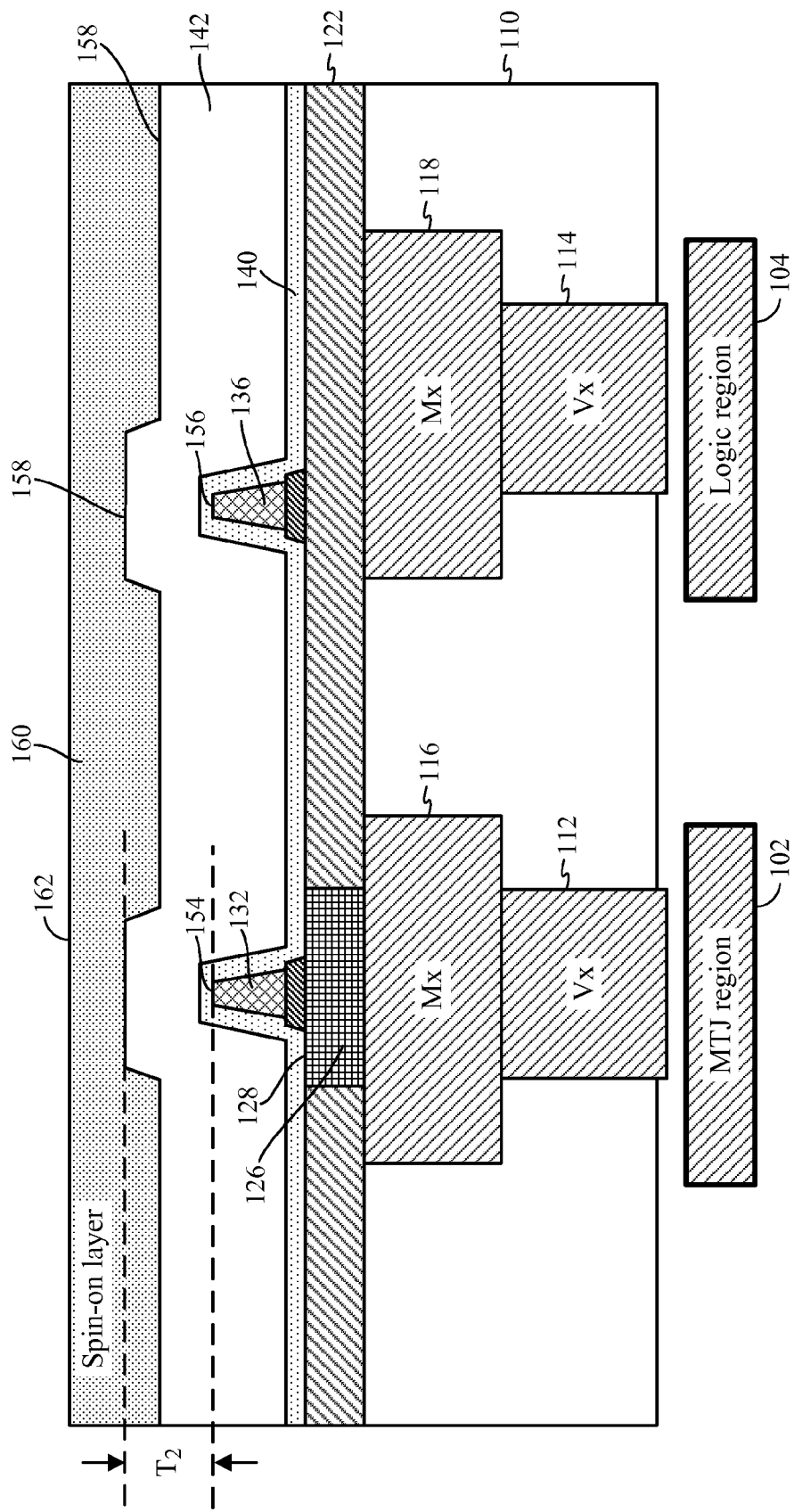
FIG. 4A is a cross-sectional view illustrating an embodiment of a process of providing a spin-on layer as an alternative to the embodiment illustrated in FIGS. 3A and 3B.

FIG. 4A is a cross-sectional view illustrating another embodiment of a process as an alternative to the embodiment illustrated in FIGS. 3A and 3B and described above. In an embodiment, a dielectric material is provided to fill the space on top of the encapsulation layer 140 to a height $T_2$ above the top surfaces 154 and 156 of the metal hard masks 132 and 136. The dielectric material that fills the space on top of the encapsulation layer 140 becomes the second dielectric layer 142. As shown in FIG. 4A, the top surface 158 of the second dielectric layer 142 may not be a smooth even surface. Instead of planarizing the top surface 158 of the second dielectric layer 142, a spin-on layer 160 is formed on the second dielectric layer 142 to provide a sufficiently flat top surface 162. Again, dummies such as the metal hard mask 136 as shown in FIG. 4A may be needed to avoid top electrode "puddles" in the logic region 104 in which active MTJs are not implemented. In an embodiment, the spin-on layer 160 may be formed by applying a spin-on coating (SOC) or advanced patterning film (APF) process to provide a sufficiently flat top surface 162. Other flattening processes may also be used within the scope of the disclosure.

Figure 4B:
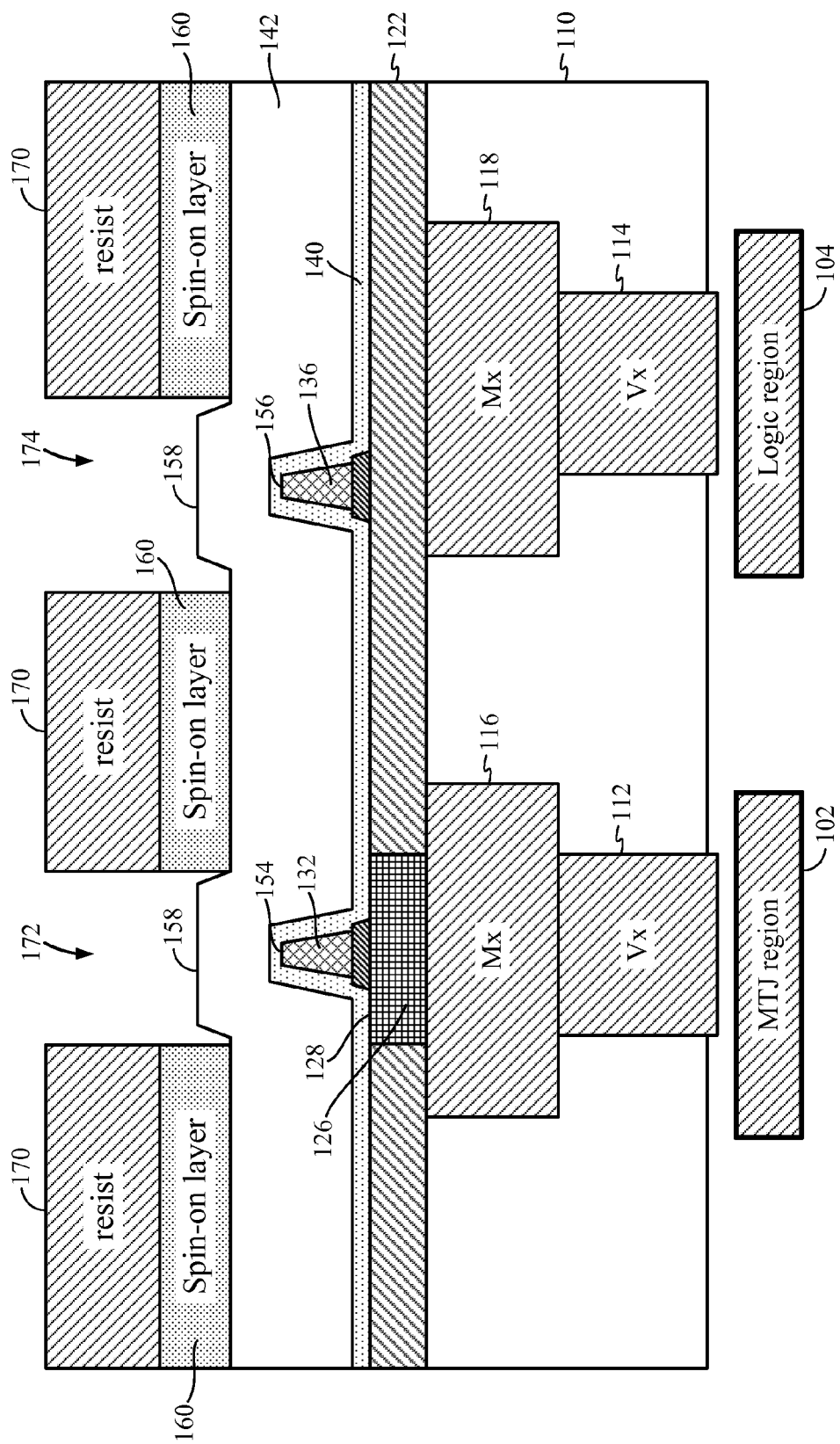
FIG. 4B is a cross-sectional view illustrating an embodiment of a process following the process of providing the spin-on layer in the embodiment illustrated in FIG. 4A.

FIG. 4B is a cross-sectional view illustrating an embodiment of a process following the process of providing the spin-on layer 160 in the embodiment illustrated in FIG. 4A. In an embodiment, a patterned resist layer 170 is provided on top of the spin-on layer 160 with openings 172 and 174 to expose the areas over the metal hard masks 132 and 136, respectively. In a further embodiment, the patterned resist layer 170 comprises a patterned photoresist layer on top of the spin-on layer 160 to expose the areas over the metal hard masks 132 and 136 by using a photolithographic process, for example. In an embodiment, the portions of the spin-on layer 160 underneath the openings 172 and 174 of the resist layer 170 and above the metal hard masks 132 and 136 are removed by etching, for example, thereby exposing the portions of the top surface 158 of the second dielectric layer 142 above the metal hard masks 132 and 136, respectively.

Figure 5:
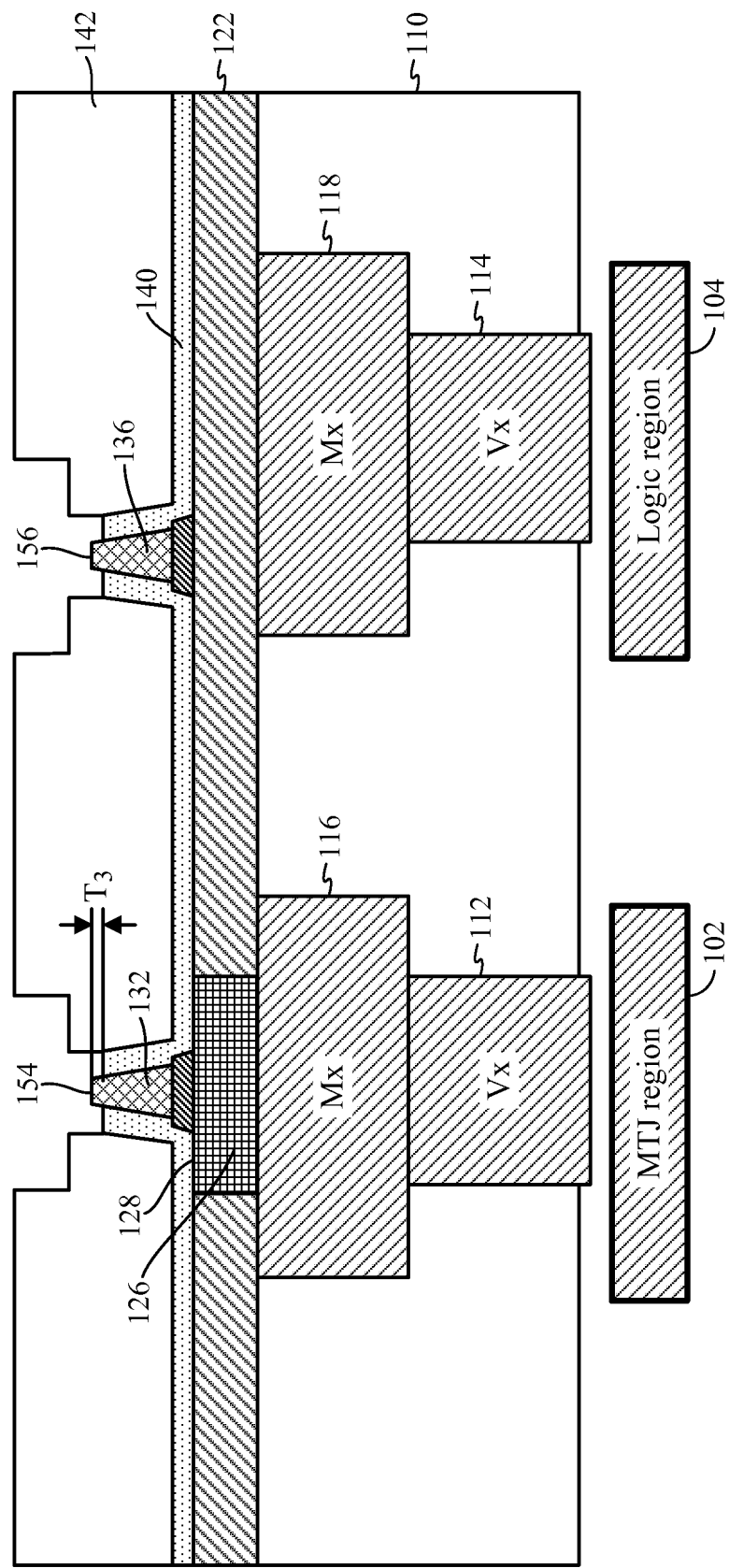
FIG. 5 is a cross-sectional view illustrating an embodiment of processes following the application of a resist layer in either the embodiment illustrated in FIG. 3B or the embodiment illustrated in FIG. 4B.

FIG. 5 is a cross-sectional view illustrating an embodiment of processes following the application of the resist layer in either the embodiment illustrated in FIG. 3B and described above or the embodiment illustrated in FIG. 4B and described above. In an embodiment, a top electrode (TE) etching process is performed to remove the top portions of the encapsulation layer 140 above and around the top surfaces 154 and 156 of the metal hard masks 132 and 136, respectively. In an embodiment, the portions of the encapsulation layer 140 above and around the top surfaces 154 and 156 of the metal hard masks 132 and 136 are etched or otherwise removed to a target depth $T_3$ below the top surfaces 154 and 156 of the metal hard masks 132 and 136. After the portions of the encapsulation layer 140 above and around the top surfaces 154 and 156 of the metal hard masks 132 and 136 are etched to the target depth $T_3$, the resist layer and the spin-on layer 160 may be stripped or otherwise removed. The target depth $T_3$ for etching may be approximately 10 nm to 20 nm below the top surfaces 154 and 156 of the metal hard masks 132 and 136, for example.

Figure 6:
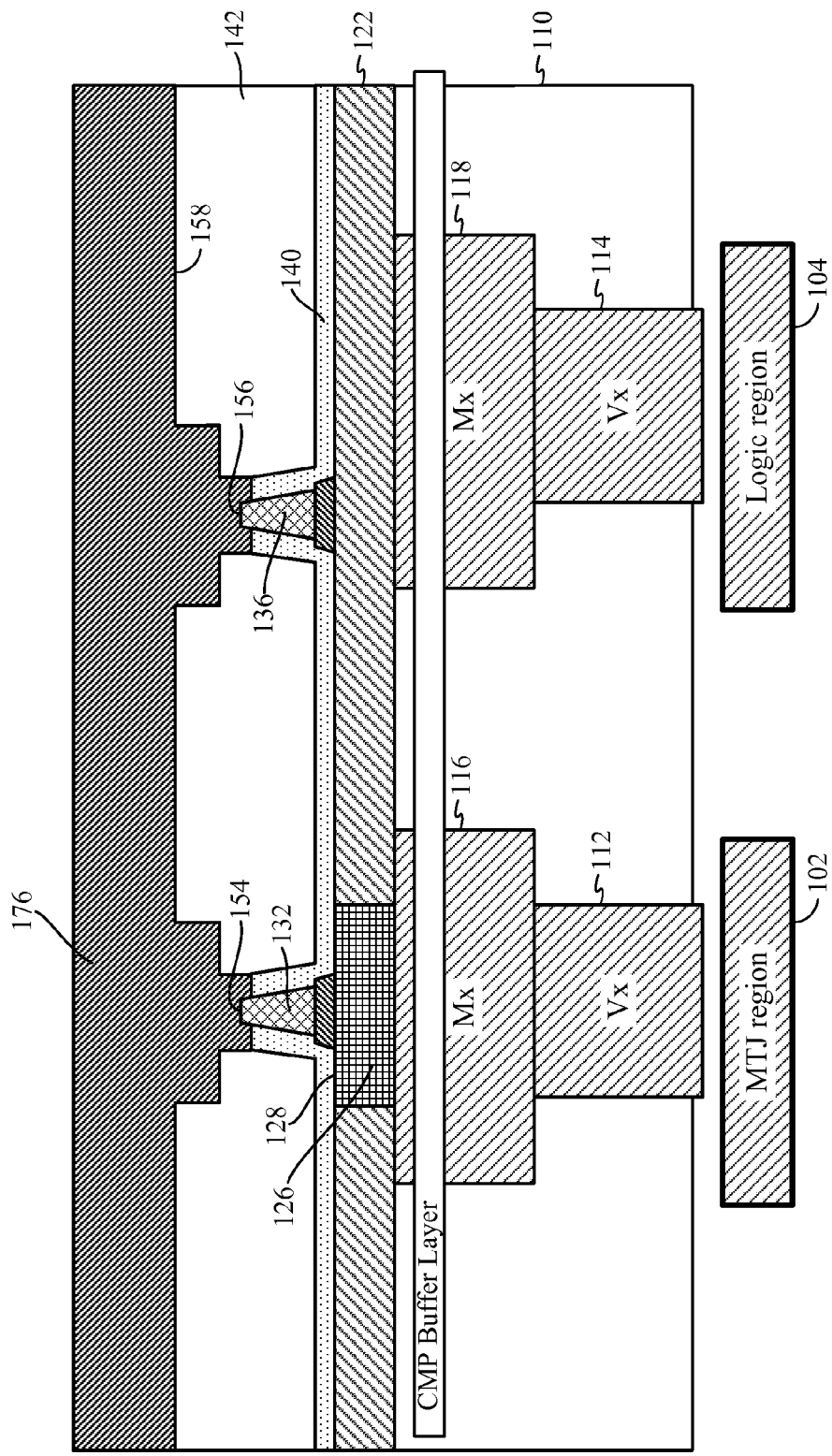
FIG. 6 is a cross-sectional view illustrating an embodiment of a process of providing a top electrode (TE) metal fill.

FIG. 6 is a cross-sectional view illustrating an embodiment of a process of providing a top electrode (TE) metal fill 176 above the exposed top surfaces 154 and 156 of the metal hard masks 132 and 136 and the top surfaces of the encapsulation 140 surrounding the metal hard masks 132 and 136 as well as the top surface 158 of the second dielectric layer 142. In an embodiment, the TE metal fill 176 may be provided by a chemical vapor deposition (CVD) or physical vapor deposition (PVD) process, for example. In an embodiment, the TE metal fill 176 comprises tungsten (W). In an alternate embodiment, the TE metal fill 176 comprises tantalum nitride (TaN). A metal fill such as tungsten may be provided by a CVD process, whereas a metal fill such as TaN may be provided by a CVD or PVD process. Various other types of metals or conductors may be used as top electrodes within the scope of disclosure. In an embodiment, the process of providing a TE metal fill is similar to a standard contact fill. Alternatively, a back-end-of-line (BEOL) copper (Cu) barrier metal process may be used in providing the TE metal fill 176. The height of the TE metal fill 176 may be in the range of approximately 100 nm to 150 nm, although the exact height of the TE metal fill is not critical, for example.

Figure 7:
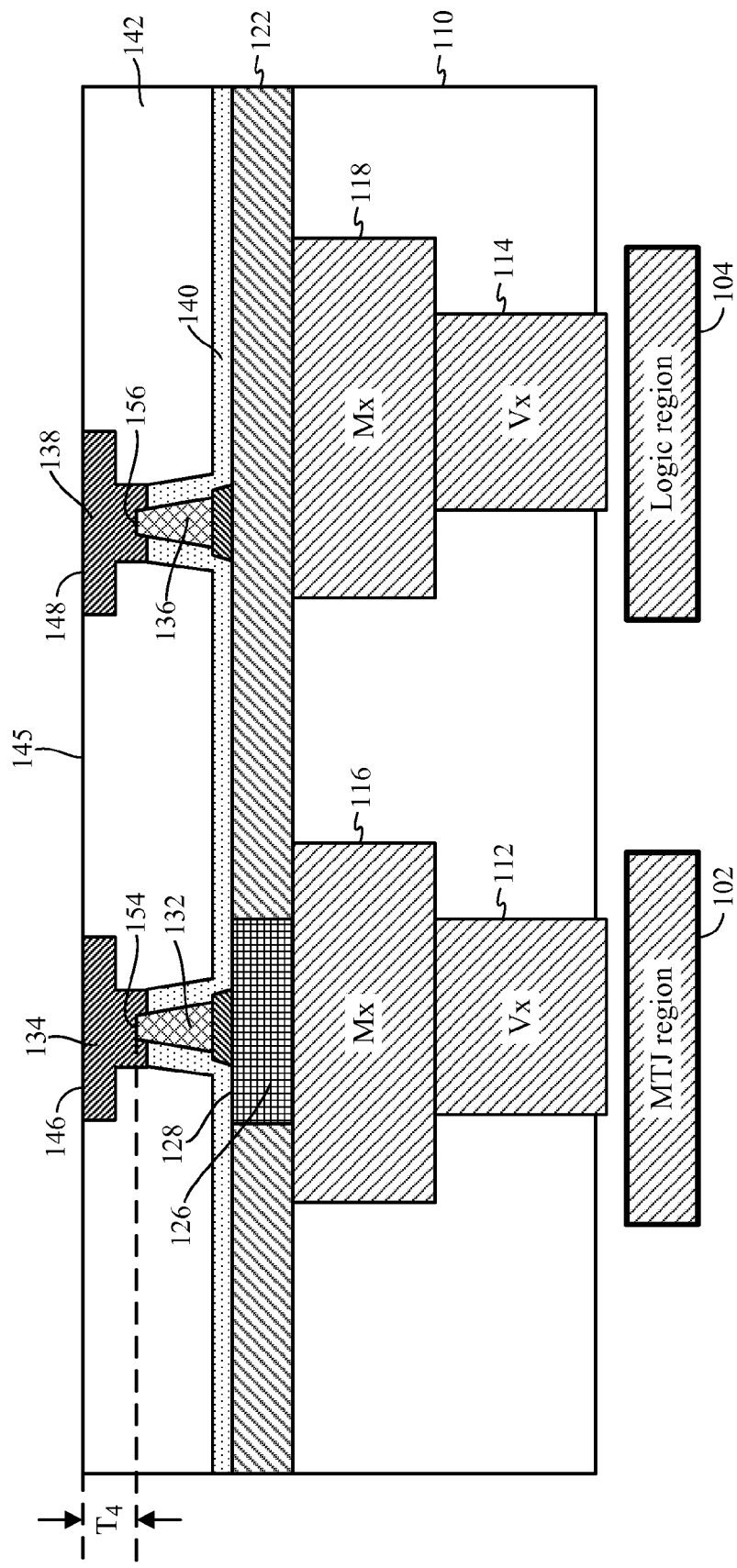
FIG. 7 is a cross-sectional view illustrating an embodiment of a process of removing an excess portion of the TE metal fill to form top electrodes or top contacts for MTJs.

FIG. 7 is a cross-sectional view illustrating an embodiment of a process of removing an excess portion of the TE metal fill 176 in FIG. 6 to form top electrodes or top contacts for MTJs.

Referring to FIG. 7, the excess TE metal fill 176 as shown in FIG. 6 has been removed and the new top surface 145 of the second dielectric layer 142 is again exposed. As shown in FIG. 7, the new top surface 145 of the second dielectric layer 142 is flush with the top surface 146 of the top contact 134 and the top surface 148 of the top contact 138 after removal of the excess TE metal fill.

In an embodiment, a metal CMP process is applied to the TE metal fill 176 as shown in FIG. 6 to remove the upper portion of the TE metal fill 176 until the second dielectric layer 142 is exposed, and at that time the metal CMP process stops. In an embodiment, the metal CMP process for removal the excess TE metal fill may be similar to a conventional BEOL barrier metal CMP process known to persons skilled in the art. In an embodiment, polishing of the top contacts 134 and 138 may continue to ensure that top surface of second dielectric layer 142 is free of metal residues even though the polishing may also remove small amounts of dielectric material from the top portion of the second dielectric layer 142. The height $T_4$ of the top surfaces 146 and 148 of the top contacts 134 and 138 above the top surfaces 154 and 156 of the metal hard masks 132 and 136 may be in the range of approximately 30 nm to 70 nm, for example.

Figure 8:
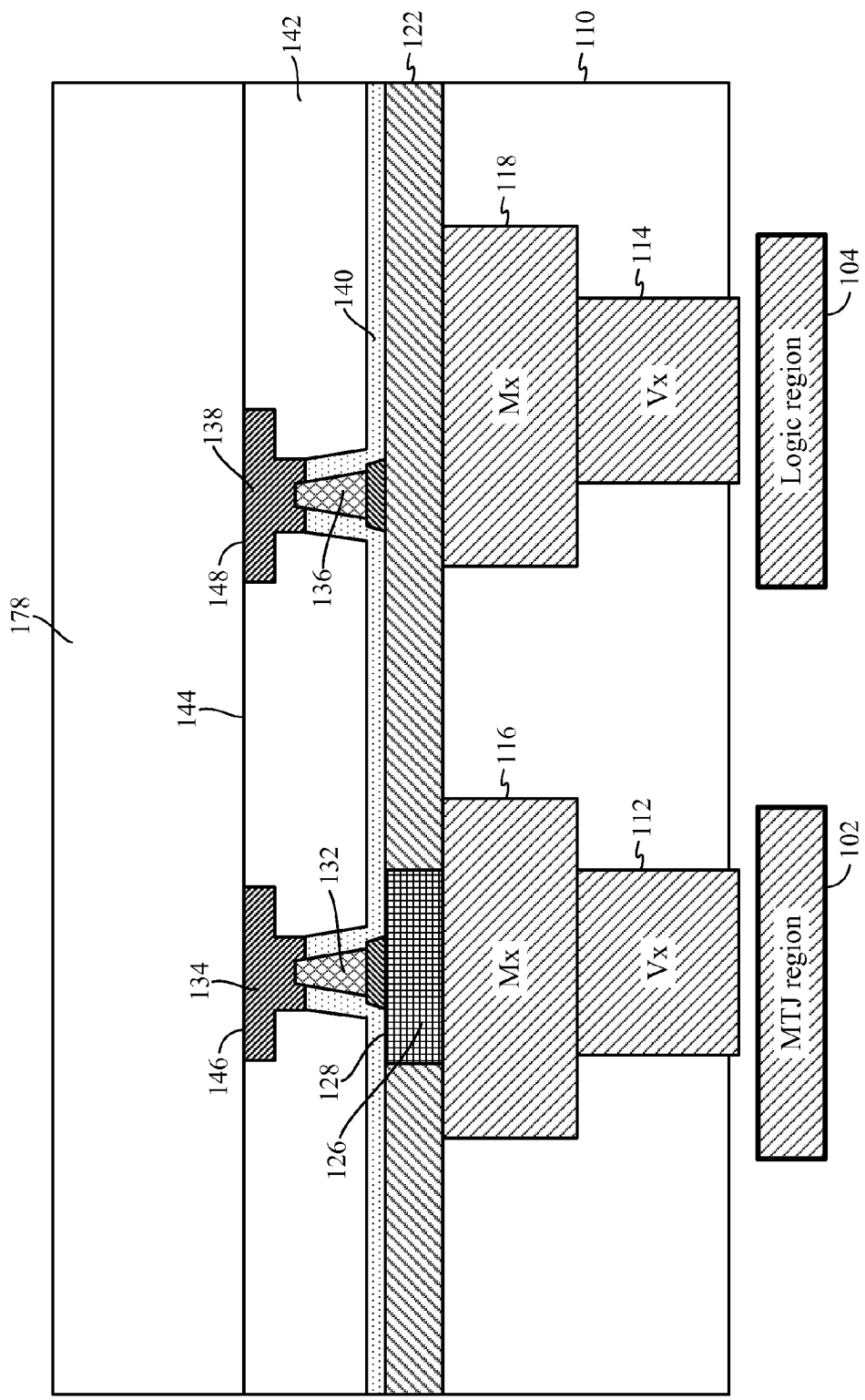
FIG. 8 is a cross-sectional view illustrating an embodiment in which an additional dielectric layer is provided for additional connections for additional circuitry above the top electrodes or top contacts of MTJs in the second dielectric layer to form an integrated circuit.

FIG. 8 is a cross-sectional view illustrating an embodiment in which an additional dielectric layer is provided for additional interconnect levels for additional circuitry above the top electrodes or contacts of MTJs in the second dielectric layer 142 to form an integrated circuit (IC). Referring to FIG. 8, a third dielectric layer 178 is provided on the top surface 144 of the second dielectric layer 142 as well as the top surfaces 146 and 148 of the top contacts 134 and 138 of the active and dummy MTJs in the MTJ region 102 and the logic region 104, respectively. In an embodiment, the third dielectric layer 178 may be deposited on the top surface 144 of the second dielectric layer 142 and the top surfaces 146 and 148 of the top contacts 134 and 138 in a conventional manner to a target thickness for a standard metal process, for example.

Figure 9:
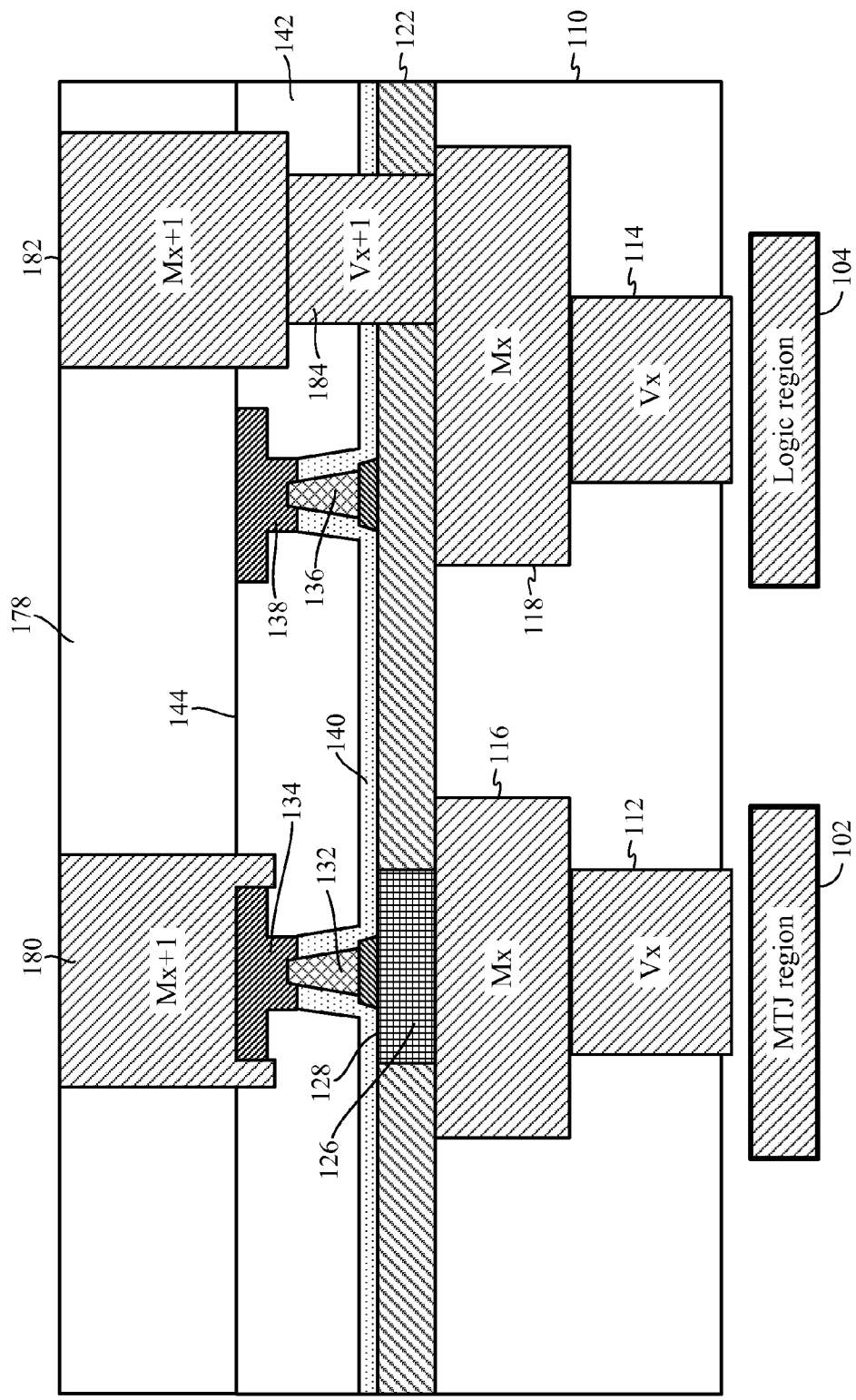
FIG. 9 is a cross-sectional view illustrating an embodiment in which additional metals are provided in the additional dielectric layer to form an IC using a dual damascene process.

FIG. 9 is a cross-sectional view illustrating an embodiment in which additional metals are provided in the third dielectric layer 178. In FIG. 9, a metal ($M_{x+1}$) 180 within the third dielectric layer 178 is formed directly on top of the metal contact 134 for the MTJ 130 in the MTJ region 102. In addition, another metal ($M_{x+1}$) 182 is formed within the third dielectric layer 178 in the logic region 104. Because the top contact 138 serves only as a dummy and is not connected to an active MTJ, the metal ($M_{x+1}$) 182 in the logic region 104 may not be electrically connected to the top contact 138. Instead, a via ($V_{x+1}$) 184 may be provided that allows for an electrical connection between the metal ($M_x$) 118 in the first dielectric layer 110 and the metal ($M_{x+1}$) 182 in the third dielectric layer 178 through the second dielectric layer 142, the encapsulation layer 140, and the dielectric layer 122. In an embodiment, the metals ($M_{x+1}$) 180 and 182 in the third dielectric layer 178 may be formed by using a standard dual damascene (DD) process known to persons skilled in the art.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A magnetoresistive random access memory (MRAM) device, comprising:
   a first dielectric layer;
   a second dielectric layer;
   a magnetic tunnel junction (MTJ) disposed between the first dielectric layer and the second dielectric layer;
   a metal hard mask coupled to the MTJ;
   a top contact coupled to the metal hard mask;
   a conductive layer directly on the top contact; and
   an encapsulation layer between the first dielectric layer and the second dielectric layer, wherein the metal hard mask is partially surrounded by the encapsulation layer.

2. The MRAM device of claim 1, further comprising a buffer layer between the first dielectric layer and the encapsulation layer.

3. The MRAM device of claim 1, further comprising a third dielectric layer on the second dielectric layer.

4. The MRAM device of claim 3, further comprising a metal within the third dielectric layer, wherein said metal is electrically connected to the top contact.

5. The MRAM device of claim 1, wherein the MTJ is disposed in an MTJ region, further comprising a dummy fill structure in a logic region.

6. A method of making a magnetoresistive random access memory (MRAM) device, comprising:
   forming a first dielectric layer;
   forming a second dielectric layer;
   forming a magnetic tunnel junction (MTJ) between the first dielectric layer and the second dielectric layer;
   forming a metal hard mask on the MTJ;
   forming a top contact coupled to the metal hard mask;
   forming a conductive layer directly on the top contact; and
   forming an encapsulation layer between the first dielectric layer and the second dielectric layer, wherein the encapsulation layer covers the metal hard mask.

7. The method of claim 6, wherein forming the second dielectric layer comprises filling a dielectric material on top of the encapsulation layer.

8. The method of claim 7, wherein forming the second dielectric layer further comprises planarizing the dielectric material to a reduced height above the metal hard mask.

9. The method of claim 8, further comprising forming a patterned resist layer on the second dielectric layer.

10. The method of claim 9, further comprising removing a portion of the second dielectric layer and a portion of the encapsulation layer to expose a top surface of the metal hard mask through the patterned resist layer.

11. The method of claim 6, further comprising forming a spin-on layer on the second dielectric layer.

* * * * *